United States Patent
Fishman et al.

[19]

[11] Patent Number: 5,940,273
[45] Date of Patent: Aug. 17, 1999

[54] SEMICONDUCTOR CLAMPING DEVICE

[75] Inventors: Oleg S. Fishman, Maple Glen, Pa.; Andrew A. Salas, Westampton; Adrian M. Escriba, Sr., Mt. Laurel, both of N.J.

[73] Assignee: Inductotherm Corp., Lancocas, N.J.

[21] Appl. No.: 09/093,123

[22] Filed: Jun. 8, 1998

[51] Int. Cl.⁶ ........................................ H05K 7/20
[52] U.S. Cl. .................. 361/704; 165/80.2; 165/185; 174/16.3; 257/727
[58] Field of Search ................... 165/80.2, 80.3, 165/185; 174/16.3; 257/706–707, 712–713, 718–719, 726–727; 361/704, 707, 709–710, 717–718, 722

[56] References Cited

U.S. PATENT DOCUMENTS

| | | | |
|---|---|---|---|
| 3,786,168 | 1/1974 | Jaecklin et al. | 174/16.3 |
| 3,864,607 | 2/1975 | Phillips | 361/710 |
| 3,943,426 | 3/1976 | Thiele et al. | 257/719 |
| 4,029,141 | 6/1977 | Ferrari et al. | 257/719 |
| 4,338,652 | 7/1982 | Romanczuk et al. | 257/726 |
| 4,636,917 | 1/1987 | Jouanny | 361/707 |
| 5,392,193 | 2/1995 | Robertson, Jr. et al. | 361/710 |

*Primary Examiner*—Gregory Thompson
*Attorney, Agent, or Firm*—Seidel Gonda Lavorgna & Monaco PC

[57] ABSTRACT

The present invention relates to a clamping device for increasing the heat transfer between a semiconductor device and a heat dissipating device. The clamping device comprises a clamp having a pair of cooperating jaws. A resiliently biased pressure distribution member extends from one of the jaws. The pressure distribution member and the other jaw are adapted to hold a semiconductor device in contact with the heat dissipating device. A tie rod extends between the clamp jaws. A collar is provided having a central cavity for holding the semiconductor device within and aligning the semiconductor device with respect to the heat dissipating device and the clamp. The collar also has a channel for engaging the tie rod and aligning the collar such that the semiconductor device is aligned between the pressure distribution member and the opposite clamp jaw.

20 Claims, 5 Drawing Sheets

5,940,273

SEMICONDUCTOR CLAMPING DEVICE

FIELD OF THE INVENTION

This invention relates to a clamping device for applying more uniform clamping to and increasing the heat transfer between a semiconductor device and a heat dissipating device.

BACKGROUND OF THE INVENTION

High-powered semiconductor devices, such as diodes and SCRS, must be cooled to prevent failure caused by overheating. Typically, heat dissipating devices, such as heat sinks or chill blocks, are clamped to the semiconductor device to dissipate the heat generated by the semiconductor. Usually, the clamping force is of the order of 10,000 pounds. It is essential that uniform, intimate contact be obtained between the heat dissipating devices and the semiconductor, and this requires that the pieces be clamped parallel to each other within the tolerance limit to which the corresponding semiconductor surfaces are parallel.

One of the disadvantages associated with existing clamping devices is overtightening and uneven application of clamping forces. Overtightening may cause the shapes of the semiconductor device and the heat dissipating device to distort. This distortion may cause the interface between the semiconductor device and the heat dissipating devices to become skewed, which decreases the contact surface area between the two, thus reducing heat transfer from the semiconductor to the heat dissipating device.

Another disadvantage associated with existing clamping devices is that the semiconductor device may be located or become positioned off-center from the clamp jaws. This also reduces the contact surface area between the semiconductor device and the heat dissipating device, which results in reduced heat transfer.

The present invention accurately centers the semiconductor device between the heat dissipating devices and enables the semiconductor device and the heat dissipating devices to fit uniformly flat against each other for maximum heat transfer therebetween.

SUMMARY OF THE INVENTION

The present invention relates to a clamping device for applying more uniform clamping forces to and increasing the heat transfer between a semiconductor device and a heat dissipating device. The clamping device comprises a clamp having a pair of cooperating jaws. A resiliently biased pressure distribution member extends from one of the jaws toward the other jaw. The pressure distribution member and the other jaw are adapted to hold a semiconductor device in contact with the heat dissipating device. A locating pin extends between the clamp jaws. A collar is provided having a central cavity for holding the semiconductor device within it and aligning the semiconductor device with respect to the heat dissipating device and the clamp. The collar also has a channel for engaging the locating pin and aligning the collar such that the semiconductor device is aligned between the pressure distribution member and the opposite clamp jaw.

The clamping device may be provided with a pair of threaded rods which connect the clamp jaws. The ends of the threaded rods extend through one of the jaws. A resilient biasing member is located on each rod and an adjustment member is located on the extending end of each rod for displacing the jaws and clamping the semiconductor device and the dissipating device together.

The collar may comprise separable cooperative portions which are removably secured together.

The clamping device may include a second locating pin. Where a second locating pin is used, the collar further comprises a second channel for engaging the second locating pin.

The pressure distribution member may be formed from a plate and a threaded rod extending transversely therefrom. The threaded rod extends through a channel in the clamp jaw. The pressure distribution member is biased by a spring washer located on the threaded rod. The adjustment member may be a nut located on the end of the threaded rod for applying a force to the pressure distribution member against the force of the spring washer.

To avoid overtightening of the clamp, an indicator may be provided for indicating when the force applied to the pressure distribution member varies from a preselected force. The indicator may comprise a washer located on the threaded rod of the pressure distribution member.

The heat dissipating device may comprise a pair of heat dissipating members such as chill blocks. The semiconductor device is interposed between the pair of heat dissipating members.

BRIEF DESCRIPTION OF THE DRAWINGS

For the purpose of illustrating the invention, there is shown in the drawings a form which is presently preferred; it being understood, however, that this invention is not limited to the precise arrangements and instrumentalities shown.

FIG. 3B is a cross-sectional view taken along lines 3b—3b of FIG. 3a.

DESCRIPTION OF THE INVENTION

Figure 1:
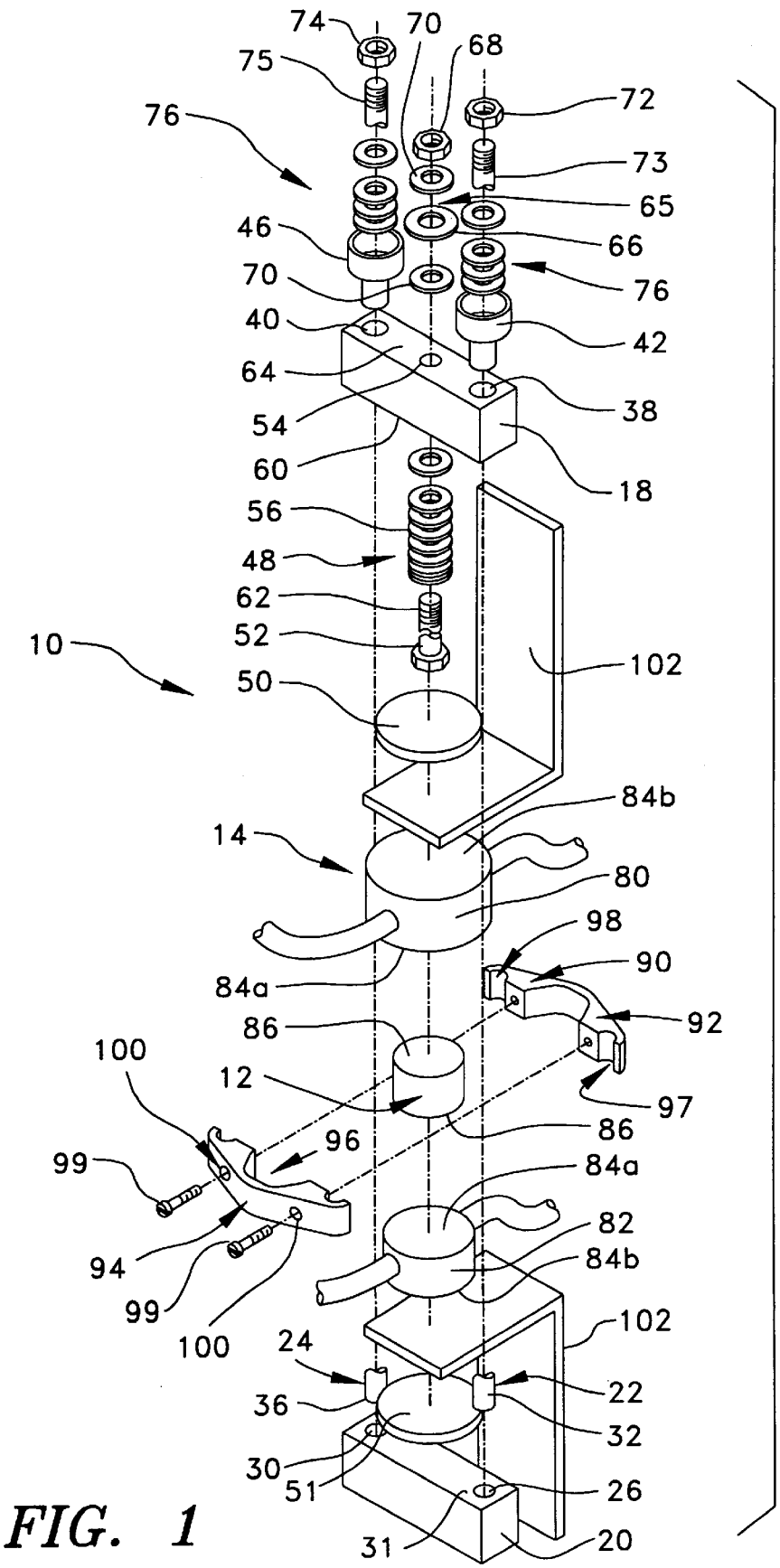
FIG. 1 is an isometric exploded view of the clamping device of the present invention.
Figure 2:
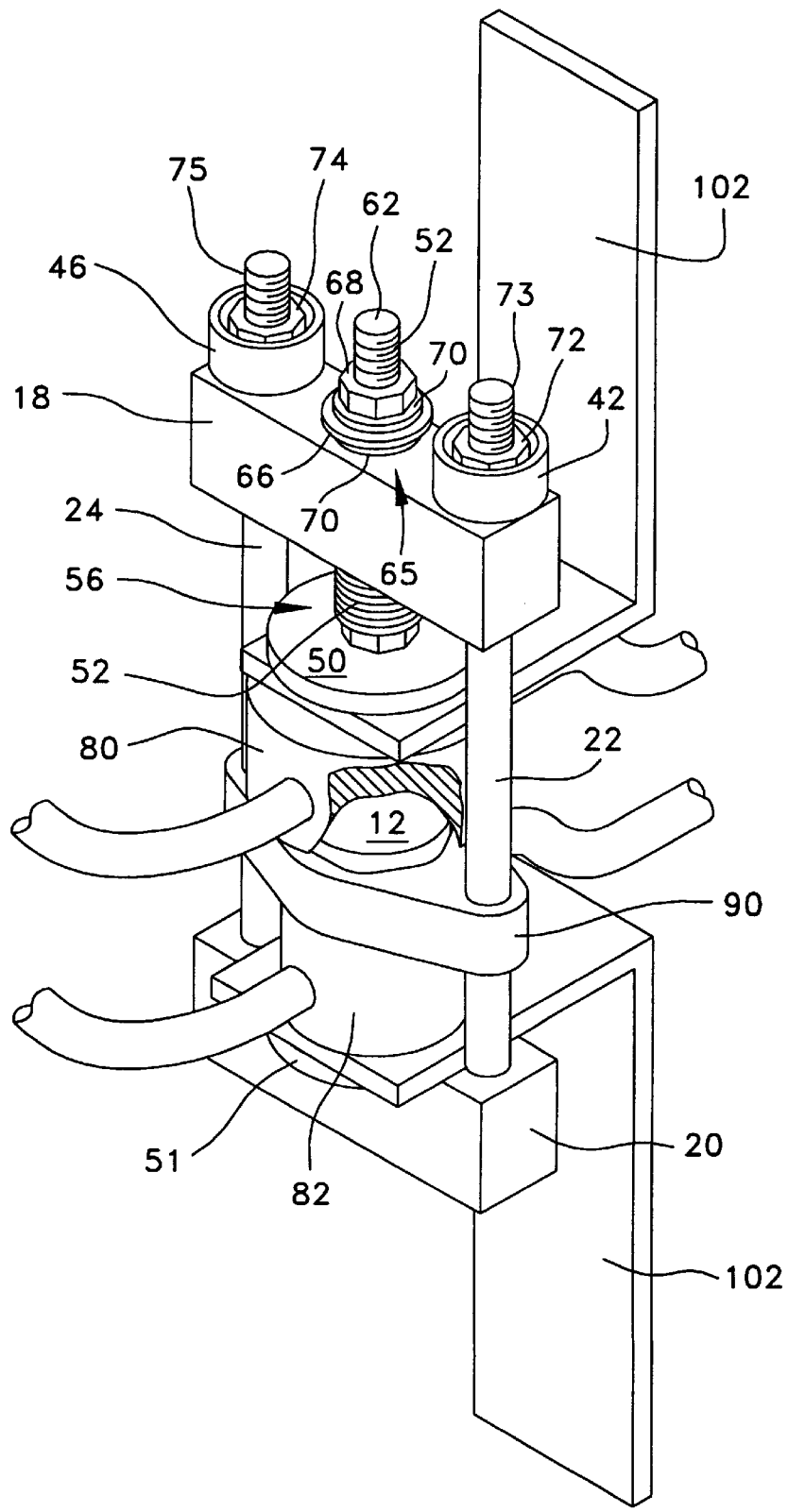
FIG. 2 is an isometric view of the clamping device shown in FIG. 1.

In FIGS. 1 and 2, there is illustrated a clamping device 10 for increasing the heat transfer between a semiconductor device 12, such as a diode or SCR, and a heat dissipating device 14, such as a chill block or heat sink. The clamping device 10 includes a clamp having a pair of opposed jaws 18 and 20. The jaws are connected by a pair of tie rods 22 and 24. A pair of spaced bores or channels 26 and 30 are formed in the inner face 31 of the jaw 20. The ends 32 and 36 of tie rods 22 and 24, respectively, are secured within the bores 26 and 30, such as by means of a cooperative threaded connection or the like.

A pair of bores or channels 38 and 40 are formed in the jaw 18. The bores 38 and 40 extend through the inner 60 and outer 64 faces of the jaw 18. When the clamp 10 is assembled, the tie rods 22 and 24 extend through the bores 38 and 40. Electrically insulating cups 42 and 46 are disposed within the channels 38 and 40 on the outer face 64 of the jaw 18. The tie rods 22 and 24 are preferably fabricated from steel and surrounded by an insulated glass sleeve. The glass sleeves and the insulating cups electrically isolate the clamp jaws 18 and 20 from the rods 22 and 24 and from each other.

Threaded ends 73 and 75 of rods 22 and 24, respectively, are secured to the jaw 18 by means of fasteners 72 and 74, such as the threaded nut and bolt connection illustrated. Threaded fasteners may also act as adjustment members for the clamp 16. A plurality of washers 76 can be stacked on each rod 73 and 75 between the insulating cup 42 and the fasteners 72 and 74, serving as spacers. The washers 76 can include flat and spring-type washers.

A pressure distribution member 48 extends from the inner face 60 of the jaw 18 in the direction of the other jaw 20. The pressure distribution member 48 includes a pressure distribution plate or disk 50. A bolt 52 extends through a central bore 54 formed in the jaw 18. A resilient biasing member 56, such as stacked spring washers or Belleville washers, are disposed on the shank of bolt 52 between the plate 50 and the inner face 60 of the jaw 18. The resilient biasing member 56 biases the pressure distribution member 48 toward the opposing jaw 20. The end 62 of the rod 52 extends through bore 54 and extends beyond the outer face 64 of jaw 18. The bolt 52 is tightened or secured to the jaw 18 by a fastener 68, such as the threaded nut and bolt connection shown. Threaded fastener 68 also acts as an adjustment member for the pressure distribution member 48.

An indicator 65 for indicating when the clamping force exceeds the force applied to the pressure distribution member is located on the end 62 of bolt 52 between the fastener 68 and the outer face 64 of the jaw 18. In the embodiment shown, the indicator 65 comprises a plurality of washers (three washers being illustrated in the preferred embodiment) comprising a large diameter center washer 66 interposed between a pair of smaller diameter washers 70.

The heat dissipating device 14 includes a pair of heat dissipating elements 80 and 82. The semiconductor device 12 is interposed between the heat dissipating elements 80 and 82. The heat dissipating elements 80 and 82 are illustrated as chill blocks, known in the art, which carry heat away from the semiconductor device 12. Coolant flows through internal channels within the chill blocks to extract heat from the semiconductor device 12.

The heat dissipating elements 80 and 82 have opposing planar faces 84a and 84b. Typically, the semiconductor device 12 has opposed planar surfaces 86 which contact the planar surfaces 84a of the heat dissipating elements 80 and 82 when the semiconductor device is placed therebetween. The planar surfaces 84a and 86 are complementary to and co-planar with each other, and maximize the available heat transfer area between the semiconductor device 12 and the heat dissipating elements 80 and 82.

Figure 3A:
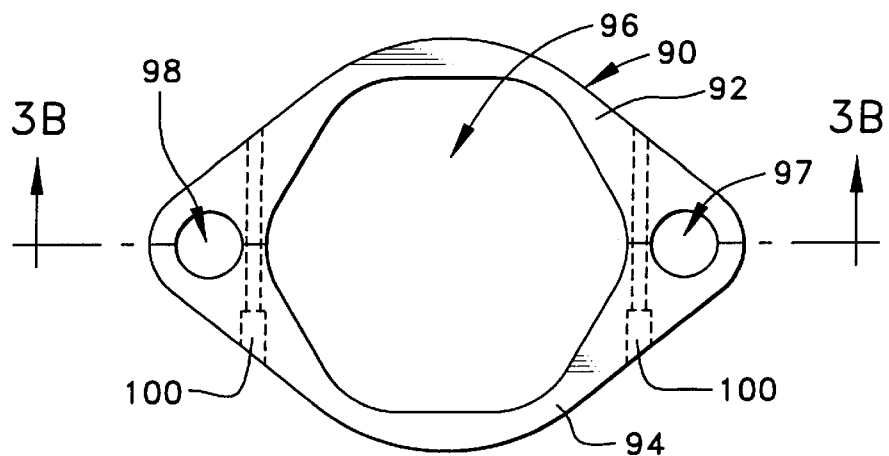
FIG. 3A is a top plan view of the collar of the clamping device shown in FIG. 1.
Figure 3B:
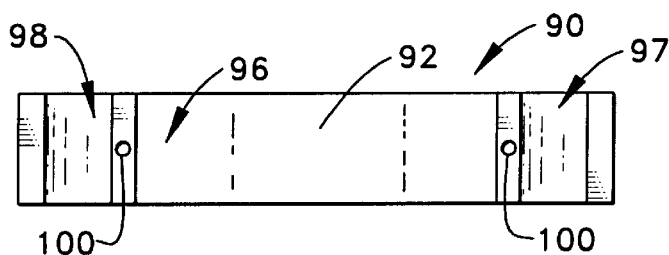

A collar 90 is provided for locating the semiconductor device 12 within the clamping device 10. As best seen in FIGS. 3A and 3B, the collar preferably, although not necessarily, comprises a pair of cooperative halves or portions 92 and 94. A central cavity 96 is formed in the body of collar 90 for receiving the semiconductor device 12. A pair of bores or channels 97 and 98 are formed at each end of the collar 90 for receiving the locating rods 22 and 24. Where collar 90 is composed of two halves 92 and 94, the cooperative collar portions 92 and 94 are secured together by means of fasteners, such as screws 99 which extend through transverse threaded bores 100 formed in the collar halves.

As shown in FIGS. 3A and 3B, the central opening 96 can have any shape which is capable of receiving the semiconductor device 12 within it, such as the hexagonal shape shown. Preferably, the shape is selected to reduce the tendency of the semiconductor device 12 to distort under the high pressure applied, so that the planar surfaces 86 of the semiconductor device 12 remain parallel to and co-planar with the inner faces of the jaws 18 and 20 and centered thereon when the bores 97 and 98 are engaged with the locating pins 22 and 24. The height of the collar is less than the height of the semiconductor device, as best seen in FIG. 2.

Figure 4A:
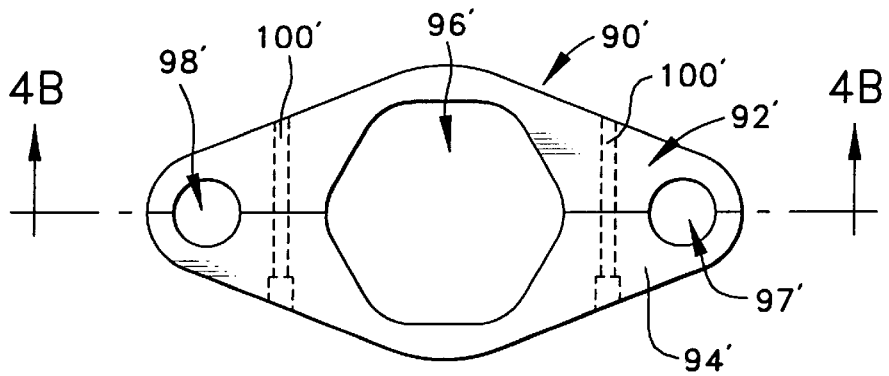
FIG. 4A is a top plan view of an alternate collar for use with clamping device shown in FIG. 1.
Figure 4B:
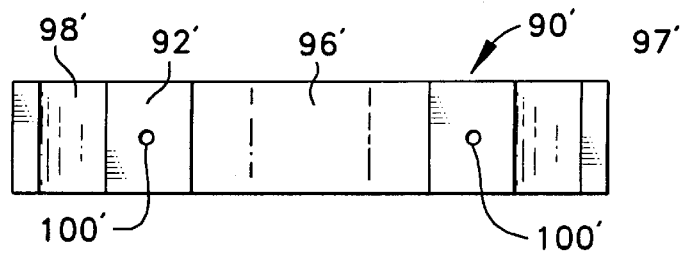
FIG. 4B is a cross-sectional view taken along lines 4B—4B of FIG. 4A.

FIGS. 4A and 4B show an alternate collar 90' which is sized to receive a smaller semiconductor device, such as a diode. Parts which are similar to those depicted in FIGS. 3A and 3B are shown primed (').

Figure 5A:
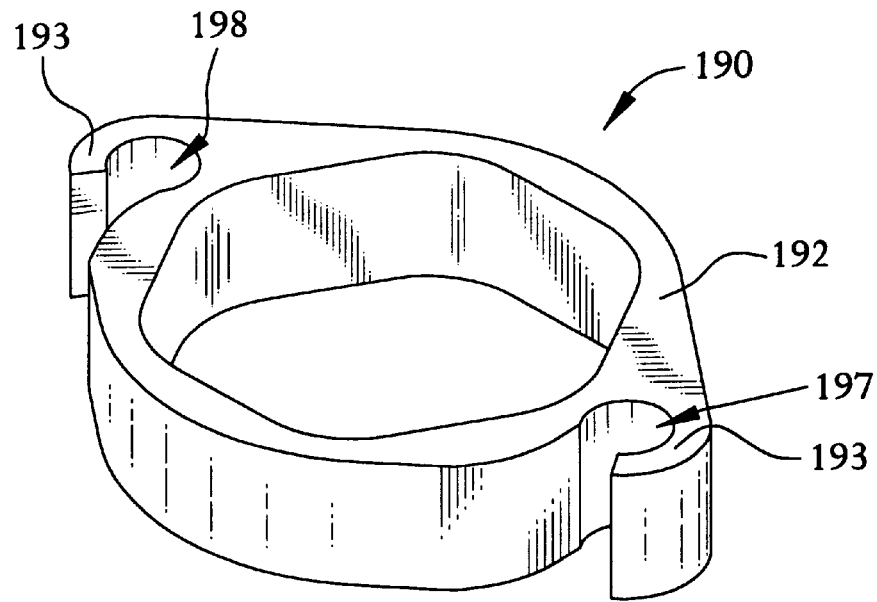
FIG. 5A is a isometric view of a second alternate collar for use with clamping device shown in FIG. 1.
Figure 5B:
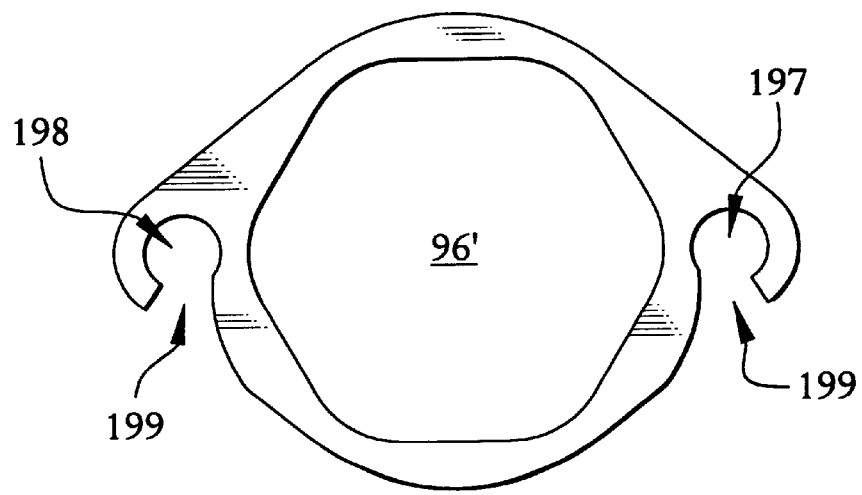
FIG. 5B is a top view of the collar of FIG. 5A.

FIGS. 5A and 5B show a second alternate collar 190. Parts which are similar to those depicted in FIGS. 3A and 3B are shown primed ('). The collar 190 comprises a unitary body 192. An arcuate extension 193 is formed at either end of the collar body 192. The arcuate extensions 193 form semicircular open channels 197 and 198 in the body 192 for receiving the tie rods 22 and 24. As best seen in FIG. 5B, each arcuate extension 193 forms an opening 199 in one side of each of the channels 197 and 198 which allow the tie rods 22 and 24 to enter the channels. Preferably, the size of the opening 199 is less than the diameter of the tie rods 22 and 24. In that case, the collar body 192 and the arcuate extensions 193 are formed from a semi-flexible material which allows the extensions 193 to deform to accept one of the tie rods 22 and 24 and retain it in the respective channel 197, 198.

Figure 6A:
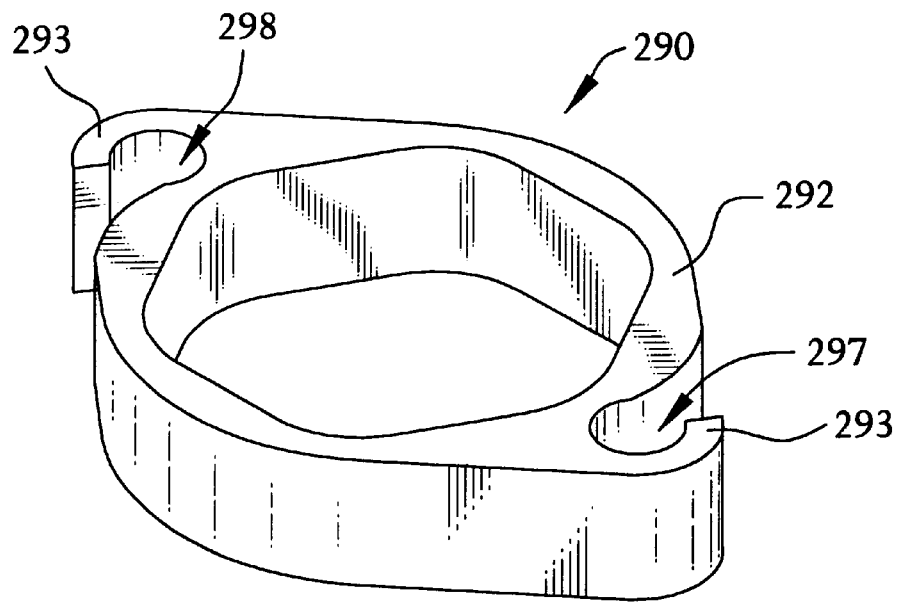
FIG. 6A is a isometric view of a third alternate collar for use with clamping device shown in FIG. 1.
Figure 6B:
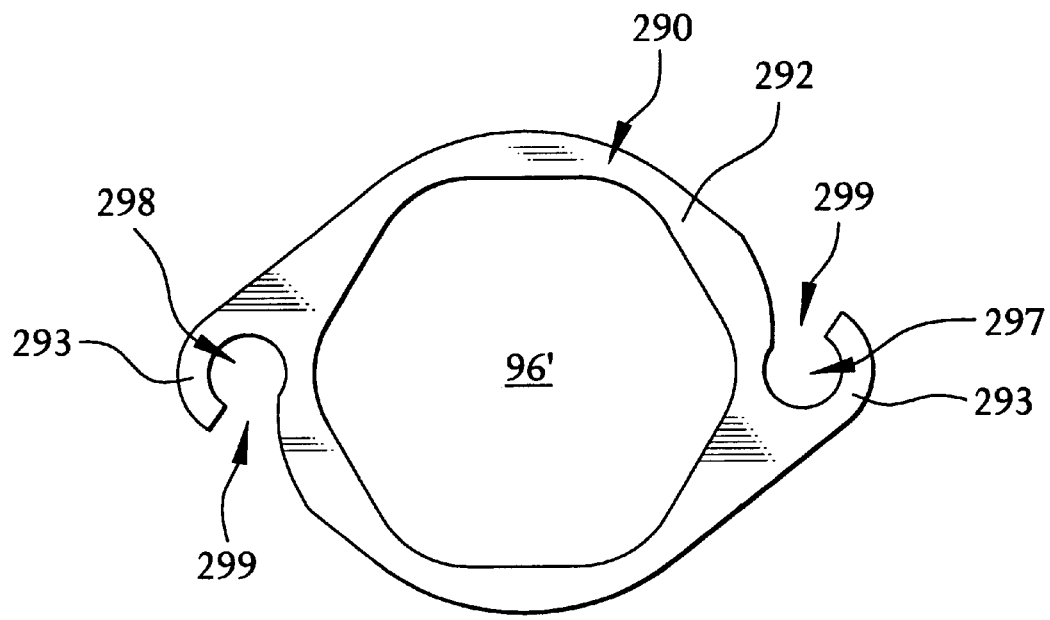
FIG. 6B is a top view of the collar of FIG. 6A.

FIGS. 6A and 6B show a third alternate collar 290. The collar 290 is similar to the collar 190 except that the arcuate extensions 293 extend from opposite sides of the collar body 292, so that the opening 299 of the channel 298 is opposite to the opening 299 of the channel 297.

An electrical contact member 102 is located between the heat dissipating element 80 and the pressure distribution plate 50. A similar electrical contact member 102 is disposed between the heat dissipating element 82 and the pressure distribution plate 51. The electrical contact members 102 serve as electrical terminal connections for the semiconductor device 12.

In operation, the head of bolt 52 of the pressure distribution member 48 is pressed against the jaw 18 by any suitable means, such as a press. A preselected amount of pressure, such as 10,000 pounds, is applied to the pressure distribution member 48. This compression force compresses the spring washers 56. Fastener nut 68 is then tightened onto the threaded end 62 of bolt 52 to secure the pressure distribution member 48 to the jaw 18 at the preselected pressure.

At this stage, the clamping device 10 is partially assembled such that the tie rods 22 and 24 extend through the bores 38 and 40 of jaw 18 in the insulating cups 42 and 46. The washers 76 and the nuts 72 and 74 are placed on the threaded ends of the tie rods 22 and 24, but the nuts 72 and 74 are loosely tightened thereon.

The collar 90 is assembled with the bores 97 and 98 engaged with the tie rods 22 and 24 and with the semiconductor device 12 disposed within the central cavity 96. The fasteners 99 secure the cooperating portions 92 and 94 of the collar 90 together to lock the semiconductor device 12 within the cavity 96 and the tie rods 22 and 24 within bores 97 and 98, respectively. When secured in this manner, the semiconductor device 12 is centered with respect to the jaws 18 and 20. The heat dissipating elements 80 and 82 are positioned on either side of the semiconductor device 12 such that the planar surfaces 84a of the heat dissipating devices are in intimate contact and co-planar with the planar surface 86 of the semiconductor device. The electrical contact members 102 are located between the heat dissipating element 82 and the pressure distribution plate 51, and between the heat dissipating element 80 and the pressure distribution plate 50.

At this point, the nuts 72 and 74 are tightened to clamp the semiconductor device 12 between the heat dissipating elements 80 and 82. As the nuts 72 and 74 are tightened, the pressure distribution plate 50 engages the electrical contact member 102 which, in turn, engages the planar surface 84b of the heat dissipating element 80. Similarly, the inner face of the jaw 20 engages through the plate 50a and an electrical contact member 102 the planar surface 84b of the heat dissipating element 82.

As the clamping device 10 is tightened, the pressure distribution plates 50 and 51 press the heat dissipating elements 80 and 82, the semiconductor device 12, and the electrical contact members 102 together. Further tightening of the nuts 72 and 74 will continue to apply increasing pressure to the heat dissipating elements and the semiconductor device. Eventually, the clamping force will equal the preselected force which is pre-loaded onto the pressure distribution member 48. When the washer 66 is able to rotate freely on the rod 52, the operator knows that the heat dissipating elements 80 and 82 and the semiconductor device 12 have been loaded to the pre-selected force. Since the amount of force applied to the heat dissipating devices and the semiconductor devices is accurately indicated by the ability of washer 66 to rotate freely once the pre-selected force is reached, the problem of overtightening the clamping device is prevented.

The present invention may be embodied in other specific forms without departing from the spirit or essential attributes thereof and, accordingly, reference should be made to the appended claims, rather than to the foregoing specification, as indicating the scope of the invention.

What is claimed is:

1. A clamping device for increasing the heat transfer between a semiconductor device and a heat dissipating device comprising:
    a clamp having a pair of cooperating jaws;
    a resiliently biased pressure distribution member extending from one of the jaws toward the other jaw, the pressure distribution member and the other jaw being adapted to hold a semiconductor device in contact with a heat dissipating device between them;
    a tie rod extending between the jaws; and
    a collar having
        (i) a central cavity for holding the semiconductor device therein and aligning the semiconductor device with respect to the heat dissipating device and the clamp and
        (ii) a channel for engaging the tie rod and aligning the collar to align the semiconductor device between the pressure distribution member and the other jaw.

2. The clamping device of claim 1, wherein the collar comprises separable cooperative collar portions and a fastener for removably securing the cooperative collar portions together to form the collar.

3. The clamping device of claim 1, wherein the collar comprises a resilient arcuate extension which forms the channel.

4. The clamping device according to claim 1, further comprising a second tie rod extending between the jaws, the collar further comprising a second channel for engaging the second tie rod.

5. The clamping device according to claim 1, wherein the pressure distribution member comprises an elongated member extending through an opening in said one jaw, the pressure distribution member being biased toward said other jaw by a resilient biasing member acting on the elongated member, and an adjustment member located on an end of the elongated member for applying a force to the pressure distribution member against the force of the resilient biasing member.

6. The clamping device according to claim 1, wherein the pressure distribution member comprises a threaded bolt extending through a bore formed in said one jaw, the pressure distribution member being biased toward said other jaw by a spring washer located on the threaded bolt, and an adjustment member located on the end of the threaded bolt for securing the bolt to said one jaw and applying a force to the pressure distribution member against the force of the spring washer.

7. The clamping device according to claim 6 further comprising an indicator for indicating when the force applied to the pressure distribution member differs from a preselected force.

8. The clamping device according to claim 7, wherein the indicator comprises a stack of three washers located on the threaded bolt of the pressure distribution member, the stack of washers comprising a large diameter washer interposed between two smaller diameter washers.

9. The clamping device according to claim 8, wherein the spring washer comprises a Belleville washer.

10. The clamping device of claim 4, wherein the collar comprises separable cooperative collar portions and a fastener for removably securing the cooperative collar portions together to form the collar.

11. The clamping device according to claim 4, wherein the pressure distribution member comprises a threaded bolt extending through a bore formed in said one jaw, the pressure distribution member being biased toward said other jaw by a spring washer located on the threaded bolt, and an adjustment member located on the end of the threaded bolt for securing the bolt to said other jaw and applying a force to the pressure distribution member against the force of the spring washer.

12. The clamping device according to claim 4 further comprising an indicator for indicating when the force applied to the pressure distribution member differs from a preselected force.

13. The clamping device according to claim 11, wherein the indicator comprises a stack of three washers located on the threaded bolt of the pressure distribution member, the stack of washers comprising a large diameter washer interposed between two smaller diameter washers.

14. The clamping device of claim 1 further comprising a second tie rod, the first and second tie rods comprising a pair of threaded rods connecting each jaw, the ends of the rods extending through one of the jaws, a resilient biasing device is located on each rod, a nut threaded onto the extending end of each rod and rotatable for displacing the jaws and clamping the semiconductor device and the heat dissipating device, the collar further comprising a second channel for engaging the second tie rod.

15. The clamping device of claim 4, wherein the collar comprises a pair of resilient arcuate extensions which form the channels.

16. A clamping device for applying uniform clamping forces to and increasing the amount of heat transfer between a semiconductor device and a heat dissipating device comprising:

a clamp having -a pair of cooperating jaws;

a pressure distribution member extending from one of the jaws, the pressure distribution member and the other jaw being adapted to hold a semiconductor device in contact with a heat dissipating device between them, the pressure distribution member comprising a threaded rod extending therefrom and extending through a channel in the one jaw, the pressure distribution member being biased toward the other jaw by a spring washer located on the threaded rod, a nut threaded onto the end of the threaded rod and rotatable for applying a force to the pressure distribution member against the force of the spring washer;

a pair of tie rods extending between the jaws, the tie rods comprising a pair of threaded bolts connecting each jaw, the ends of the bolts extending through one of the jaws, a resilient biasing member located on each rod, and a nut threaded onto the extending end of each rod and rotatable for displacing the jaws and clamping the semiconductor device and- heat dissipating device;

an indicator for indicating when the force applied to the pressure distribution member differs from the preselected force;

a collar having (i) a pair of channels for engaging the tie rode and aligning the collar to align the semiconductor device between the pressure distribution member and the other jaw and (ii) a central cavity for holding the semiconductor device within and aligning the semiconductor device with respect to the heat dissipating device and the clamp.

17. The clamping device of claim 16, wherein the collar comprises a pair of resilient arcuate extensions which form the channels.

18. The clamping device of claim 16, wherein the collar comprises separable cooperative collar portions and a fastener for removably securing the cooperative collar portions together to form the collar.

19. The clamping device according to claim 16, wherein the indicator comprises a stack of three washers located on the threaded rod of the pressure distribution member, the stack of washers comprising a large diameter washer interposed between two smaller diameter washers.

20. The clamping device according to claim 16, wherein the spring washer comprises a Belleville washer.

* * * * *